US011173715B2

(12) United States Patent
Koike et al.

(10) Patent No.: US 11,173,715 B2
(45) Date of Patent: Nov. 16, 2021

(54) LIQUID DISCHARGE HEAD AND PRINTER

(71) Applicant: SEIKO EPSON CORPORATION, Tokyo (JP)

(72) Inventors: Harunobu Koike, Matsumoto (JP); Takanori Aimono, Matsumoto (JP); Masao Nakayama, Shiojiri (JP); Motoki Takabe, Shiojiri (JP); Koji Sumi, Shiojiri (JP); Yasuhiro Itayama, Kai (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/830,145

(22) Filed: Mar. 25, 2020

(65) Prior Publication Data

US 2020/0307216 A1 Oct. 1, 2020

(30) Foreign Application Priority Data

Mar. 27, 2019 (JP) .............................. JP2019-060836

(51) Int. Cl.
*B41J 2/14* (2006.01)

(52) U.S. Cl.
CPC ................ *B41J 2/14233* (2013.01)

(58) Field of Classification Search
None
See application file for complete search history.

(56) References Cited

U.S. PATENT DOCUMENTS

| 2008/0034563 | A1 | 2/2008 | Xin-Shan et al. |
| 2014/0111582 | A1* | 4/2014 | Ohashi ............... B41J 2/1629 347/70 |
| 2019/0067748 | A1* | 2/2019 | Saeki ................. H01M 4/13 |

FOREIGN PATENT DOCUMENTS

| JP | 2006-286925 A | 10/2006 |
| JP | 2009-272642 A | 11/2009 |
| JP | 2011-142153 A | 7/2011 |

* cited by examiner

*Primary Examiner* — Erica S Lin
(74) *Attorney, Agent, or Firm* — Workman Nydegger (57) ABSTRACT

A liquid discharge head includes: a nozzle plate provided with a nozzle hole that discharges a liquid; a silicon substrate provided with a pressure chamber that is connected with the nozzle hole; a diaphragm provided on the silicon substrate; and a piezoelectric element that is provided on the diaphragm and that changes a volume of the pressure chamber, where: the diaphragm includes a zirconium oxide layer; the zirconium oxide layer has (−111) preferred orientation; and in X-ray diffraction of the diaphragm, a difference between a position of (002) peak of the zirconium oxide layer and a position of (220) peak of the silicon substrate is 13.26° or more and 13.30° or less.

7 Claims, 7 Drawing Sheets

| | FORMING CONDITIONS FOR ZrO₂ LAYER | | | PHYSICAL PROPERTIES OF ZrO₂ LAYER | | | | |
|---|---|---|---|---|---|---|---|---|
| | NUMBER OF STACKED LAYER(S) | FIRST HEAT TREATMENT TEMPERATURE [°C] | SECOND HEAT TREATMENT TEMPERATURE [°C] | DIFFERENCE Δ1 [°] | DIFFERENCE Δ2 [°] | FWHM [°] | CRACKING | AMOUNT OF DISPLACEMENT [nm] |
| EXAMPLE 1 | 1 | 900 | — | 13.296 | 6.512 | 0.479 | ABSENT | 984 |
| EXAMPLE 2 | 1 | 900 | 750 | 13.277 | 6.532 | 0.439 | ABSENT | 957 |
| EXAMPLE 3 | 1 | 900 | 850 | 13.269 | 6.477 | 0.320 | ABSENT | 896 |
| COMPARATIVE EXAMPLE 1 | 1 | 900 | 1000 | 13.203 | 6.424 | 0.291 | PRESENT | — |
| COMPARATIVE EXAMPLE 2 | 2 | 900 | 850 | 13.173 | 6.395 | 0.317 | PRESENT | — |

LIQUID DISCHARGE HEAD AND PRINTER

The present application is based on, and claims priority from JP Application Serial Number 2019-060836, filed Mar. 27, 2019, the disclosure of which is hereby incorporated by reference herein in its entirety.

BACKGROUND

1. Technical Field

The present disclosure relates to a liquid discharge head and a printer.

2. Related Art

A representative example of liquid discharge heads is, for example, an ink jet-mode recording head in which a diaphragm is deformed by piezoelectric elements to pressurize ink within pressure chambers, thereby discharging ink droplets from nozzle holes. As in JP-A-2011-142153, for example, a piezoelectric element used for such an ink jet-mode recording head is formed by sandwiching, between two electrodes, a piezoelectric material that exhibits an electromechanical conversion function, such as a piezoelectric layer formed from a crystallized dielectric material.

A diaphragm used in a liquid discharge head, even in the state without application of voltage to a piezoelectric element, curves toward a pressure chamber in some cases due to stress generated in the diaphragm. As a result, cracking occurs in the diaphragm in some cases.

SUMMARY

An embodiment of a liquid discharge head according to the present disclosure includes: a nozzle plate provided with a nozzle hole that discharges a liquid; a silicon substrate provided with a pressure chamber that is connected with the nozzle hole; a diaphragm provided on the silicon substrate; and a piezoelectric element that is provided on the diaphragm and that changes a volume of the pressure chamber, where: the diaphragm includes a zirconium oxide layer; the zirconium oxide layer has (−111) preferred orientation; and in the X-ray diffraction of the diaphragm, a difference between a position of the (002) peak of the zirconium oxide layer and a position of the (220) peak of the silicon substrate is 13.26° or more and 13.30° or less.

An embodiment of a liquid discharge head according to the present disclosure includes: a nozzle plate provided with a nozzle hole that discharges a liquid; a silicon substrate provided with a pressure chamber that is connected with the nozzle hole; a diaphragm provided on the silicon substrate; and a piezoelectric element that is provided on the diaphragm and that changes a volume of the pressure chamber, where: the diaphragm includes a zirconium oxide layer; the zirconium oxide layer has (−111) preferred orientation; and in the X-ray diffraction of the diaphragm, a difference between a position of the (−211) peak of the zirconium oxide layer and a position of the (220) peak of the silicon substrate is 6.47° or more and 6.54° or less.

An embodiment of a liquid discharge head according to the present disclosure includes: a nozzle plate provided with a nozzle hole that discharges a liquid; a silicon substrate provided with a pressure chamber that is connected with the nozzle hole; a diaphragm provided on the silicon substrate; and a piezoelectric element that is provided on the diaphragm and that changes a volume of the pressure chamber, where: the diaphragm includes a zirconium oxide layer; the zirconium oxide layer has (−111) preferred orientation; and in the X-ray diffraction of the diaphragm, a full width at half maximum of the (−111) peak of the zirconium oxide layer is 0.320° or more and 0.479° or less.

In the embodiment of the liquid discharge head, the diaphragm may include only one layer as the zirconium oxide layer.

In the embodiment of the liquid discharge head, the zirconium oxide layer may have a thickness of 350 nm or more and 450 nm or less.

In the embodiment of the liquid discharge head, the piezoelectric element may include a piezoelectric layer that contains a complex oxide having a perovskite structure and including lead, zirconium, and titanium.

An embodiment of a printer according to the present disclosure includes: the embodiment of the liquid discharge head; a transport mechanism that moves a recording medium relative to the liquid discharge head; and a control unit that controls the liquid discharge head and the transport mechanism.

DESCRIPTION OF EXEMPLARY EMBODIMENTS

Hereinafter, preferable embodiments of the present disclosure will be described in detail by means of the drawings. However, the embodiments described hereinafter do not unreasonably limit the content of the present disclosure recited in the claims. Moreover, all the constitution described hereinafter is not necessarily the essential constitution required for the present disclosure.

1. Liquid Discharge Head

1.1. Configuration

Figure 1:
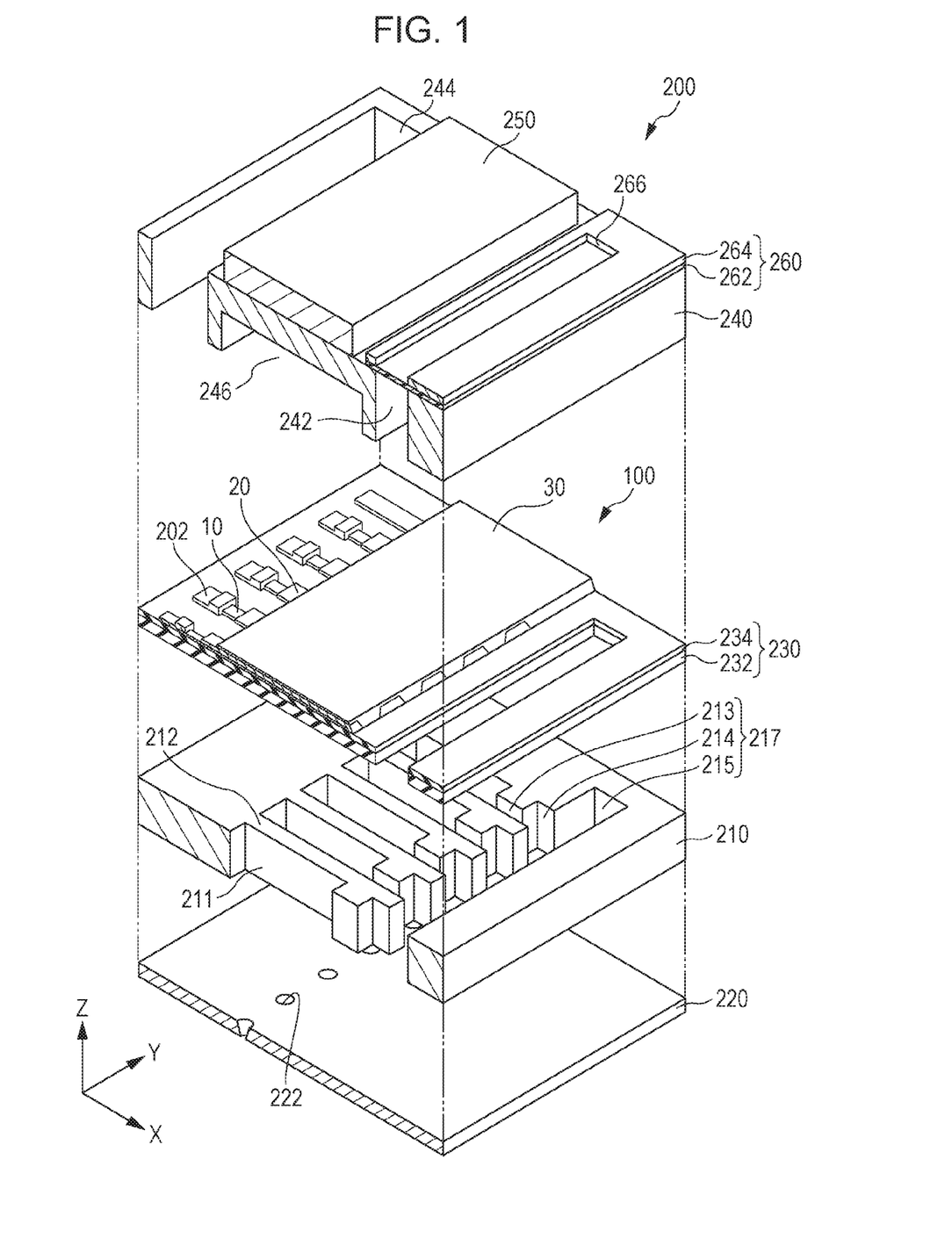
FIG. 1 is an exploded perspective view schematically illustrating a liquid discharge head according to an embodiment.
Figure 2:
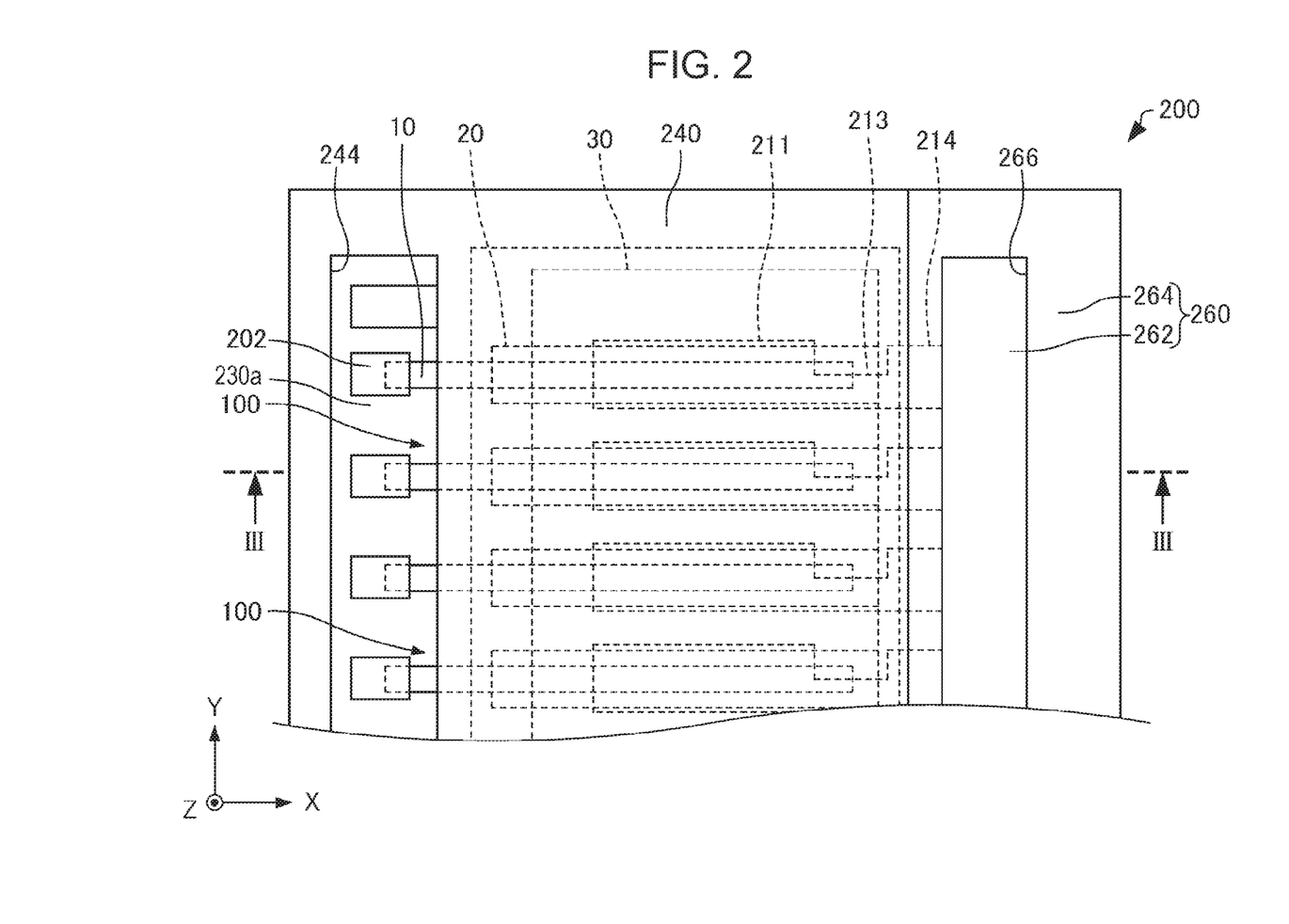
FIG. 2 is a plan view schematically illustrating the liquid discharge head according to the embodiment.
Figure 3:
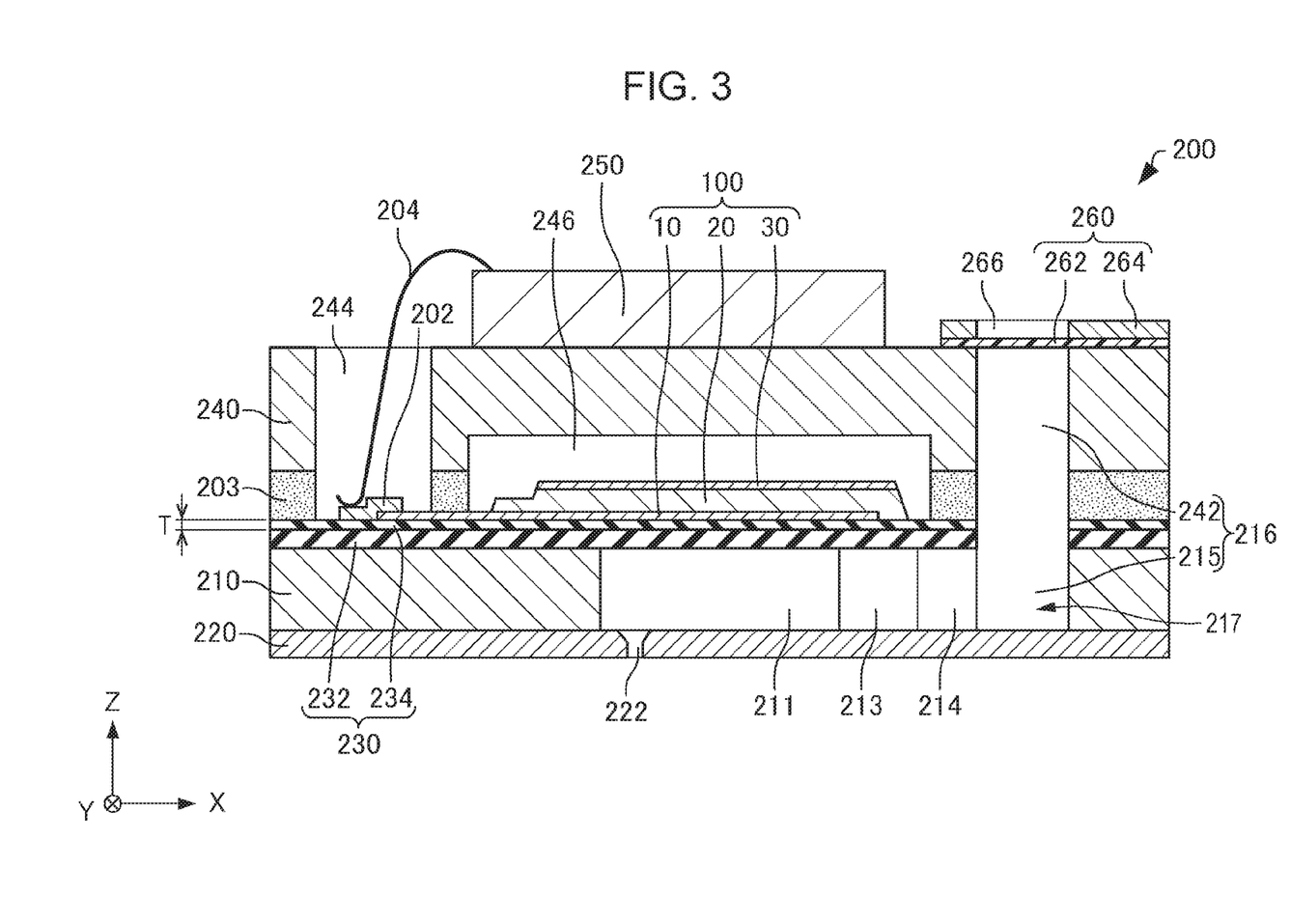
FIG. 3 is a cross-sectional view schematically illustrating the liquid discharge head according to the embodiment.

First, a liquid discharge head according to an embodiment will be described with reference to the drawings. FIG. 1 is an exploded perspective view schematically illustrating a liquid discharge head 200 according to an embodiment. FIG. 2 is a plan view schematically illustrating the liquid discharge head 200 according to the embodiment. FIG. 3 is a cross-sectional view along line III-III of FIG. 2 schematically illustrating the liquid discharge head 200 according to the embodiment. In FIGS. 1 to 3, the X-axis, the Y-axis, and the Z-axis are illustrated as three mutually orthogonal axes.

As illustrated in FIGS. 1 to 3, the liquid discharge head 200 includes, for example, a piezoelectric element 100, a silicon substrate 210, a nozzle plate 220, a diaphragm 230, a protective substrate 240, a circuit board 250, and a compliant substrate 260. Here, for convenience, the circuit board 250 is omitted from the illustration in FIG. 2.

The silicon substrate 210 is provided with a pressure chamber 211. The pressure chamber 211 is partitioned by a plurality of partition walls 212. The pressure chamber 211 changes the volume by the piezoelectric element 100.

In the +X-axis direction end of each pressure chamber 211 of the silicon substrate 210, a first communicating path 213 and a second communicating path 214 are provided. The first communicating path 213 is formed to reduce the opening area by narrowing the +X-axis direction end of the pressure chamber 211 in the Y-axis direction. The width in the Y-axis direction of the second communicating path 214 is the same as the width in the Y-axis direction of the pressure chamber 211, for example. In the +X-axis direction of the second communicating path 214, a third communicating path 215 connected with a plurality of the second communicating paths 214 is provided. The third communicating path 215 constitutes a part of a manifold 216. The manifold 216 functions as a common liquid chamber among the respective pressure chambers 211. As described above, the silicon substrate 210 is provided with the pressure chambers 211 and supply channels 217 composed of the first communicating paths 213, the second communicating paths 214, and the third communicating path 215. The supply channels 217 are connected with the respective pressure chambers 211 and supply a liquid to the pressure chambers 211.

The nozzle plate 220 is provided on one surface of the silicon substrate 210. The material of the nozzle plate 220 is SUS (steel use stainless), for example. The nozzle plate 220 is joined to the silicon substrate 210 by an adhesive or a heat-sealing film, for example. The nozzle plate 220 is provided with a plurality of nozzle holes 222 along the Y-axis. The nozzle holes 222 are connected with the respective pressure chambers 211 and discharge a liquid.

The diaphragm 230 is provided on the other surface of the silicon substrate 210. The diaphragm 230 includes, for example, a silicon oxide layer 232 provided on the silicon substrate 210 and a zirconium oxide layer 234 provided on the silicon oxide layer 232. The diaphragm 230 includes only one zirconium oxide layer 234. The thickness T of the zirconium oxide layer 234 is 350 nm or more and 450 nm or less, for example.

The piezoelectric element 100 is provided on the diaphragm 230, for example. A plurality of the piezoelectric elements 100 are provided. The number of the piezoelectric elements 100 is not particularly limited. The piezoelectric element 100 changes the volume of the pressure chamber 211.

In the liquid discharge head 200, the diaphragm 230 and a first electrode 10 are displaced by deformation of a piezoelectric layer 20 that exhibits electromechanical conversion characteristics. The detailed configuration of the piezoelectric element 100 will be described hereinafter.

The protective substrate 240 is joined to the silicon substrate 210 by an adhesive 203. The protective substrate 240 is provided with a through hole 242. In the illustrated example, the through hole 242 penetrates the protective substrate 240 in the Z-axis direction and is connected with the third communicating path 215. The through hole 242 and the third communicating path 215 constitute the manifold 216 that functions as a common liquid chamber among the respective pressure chambers 211. Moreover, the protective substrate 240 is provided with a through hole 244 that penetrates the protective substrate 240 in the Z-axis direction. In the through hole 244, the ends of lead electrodes 202 are positioned.

The protective substrate 240 is further provided with an opening 246. The opening 246 is a space for allowing the driving of the piezoelectric elements 100 without interference. The opening 246 may be sealed or not.

The circuit board 250 is provided on the protective substrate 240. The circuit board 250 includes an integrated circuit (IC) for driving the piezoelectric elements 100. The circuit board 250 and the lead electrodes 202 are electrically coupled through connecting wiring 204.

The compliant substrate 260 is provided on the protective substrate 240. The compliant substrate 260 includes a sealing layer 262 provided on the protective substrate 240 and a fixing sheet 264 provided on the sealing layer 262. The sealing layer 262 is a layer for sealing the manifold 216. The sealing layer 262 exhibits flexibility, for example. The fixing sheet 264 is provided with a through hole 266. The through hole 266 penetrates the fixing sheet 264 in the Z-axis direction. The through hole 266 is provided at a position overlapping the manifold 216 when viewed in the Z-axis direction.

1.2. Piezoelectric Element

As illustrated in FIGS. 2 and 3, the piezoelectric element 100 includes a first electrode 10, a piezoelectric layer 20, and a second electrode 30.

The form of the first electrode 10 is layered, for example. The thickness of the first electrode 10 is 3 nm or more and 200 nm or less, for example. The first electrode 10 is a metal layer, such as a platinum layer, an iridium layer, or a ruthenium layer; a conducting oxide layer thereof; a lanthanum nickel oxide ($LaNiO_3$: LNO) layer; or a strontium ruthenium oxide ($SrRuO_3$: SRO) layer, for example. The first electrode 10 may have a structure in which a plurality of the above-mentioned exemplary layers are stacked. The first electrode 10 may include titanium.

The first electrode 10 is formed as an independent, individual electrode for every pressure chamber 211. The width of the first electrode 10 in the Y-axis direction is narrower than the width of the pressure chamber 211 in the Y-axis direction. The length of the first electrode 10 in the X-axis direction is longer than the length of the pressure chamber 211 in the X-axis direction, for example. In the X-axis direction, both ends of the first electrode 10 are positioned to interpose the both ends of the pressure chamber 211 therebetween. The −X-axis direction end of the first electrode 10 is coupled to the lead electrode 202.

The first electrode 10 is either of electrodes for applying voltage to the piezoelectric layer 20. The first electrode 10 is a lower electrode provided below the piezoelectric layer 20.

The piezoelectric layer 20 is provided on the first electrode 10. The piezoelectric layer 20 is provided between the first electrode 10 and the second electrode 30. The thickness of the piezoelectric layer 20 is 500 nm or more and 5 μm or less, for example. The piezoelectric layer 20 can be deformed by applying voltage between the first electrode 10 and the second electrode 30.

The piezoelectric layer 20 contains a complex oxide having a perovskite structure and including lead (Pb), zirconium (Zr), and titanium (Ti). The piezoelectric layer 20 is a PZT layer formed of PZT. The piezoelectric layer 20 may contain an additive other than lead, zirconium, titanium, and oxygen (O). In other words, the piezoelectric layer 20 may be a PZT layer added with an additive.

The width of the piezoelectric layer 20 in the Y-axis direction is wider than the width of the first electrode 10 in the Y-axis direction, for example. The length of the piezoelectric layer 20 in the X-axis direction is longer than the length of the pressure chamber 211 in the X-axis direction, for example. The +X-axis direction end of the first electrode 10 is positioned between the +X-axis direction end of the piezoelectric layer 20 and the +X-axis direction end of the pressure chamber 211, for example. The +X-axis direction end of the first electrode 10 is covered with the piezoelectric layer 20. Meanwhile, the −X-axis direction end of the piezoelectric layer 20 is positioned between the −X-axis direction end of the first electrode 10 and the −X-axis direction end of the pressure chamber 211, for example. The −X-axis direction end of the first electrode 10 is not covered with the piezoelectric layer 20.

The second electrode 30 is provided on the piezoelectric layer 20. The form of the second electrode 30 is layered, for example. The thickness of the second electrode 30 is 15 nm or more and 300 nm or less, for example. The second electrode 30 is a metal layer, such as an iridium layer, a platinum layer, or a ruthenium layer; a conducting oxide layer thereof; a lanthanum nickel oxide layer; or a strontium ruthenium oxide layer, for example. The second electrode 30 may have a structure in which a plurality of the above-mentioned exemplary layers are stacked.

The second electrode 30 is provided, for example, on the piezoelectric layer 20 and the diaphragm 230 in a continuous manner. The second electrode 30 is formed as a common electrode shared by a plurality of the piezoelectric elements 100.

The second electrode 30 is the other electrode for applying voltage to the piezoelectric layer 20. The second electrode 30 is an upper electrode provided on the piezoelectric layer 20.

1.3. XRD Evaluation

In the X-ray diffraction (XRD) of the diaphragm 230, a difference Δ1 between a position of the (002) peak of the zirconium oxide layer 234 and a position of the (220) peak of the silicon substrate 210 is 13.26° or more and 13.30° or less. Specifically, the difference Δ1 is a value obtained by subtracting a position of the (002) peak of the zirconium oxide layer 234 from a position of the (220) peak of the silicon substrate 210.

In the XRD of the diaphragm 230, a difference Δ2 between a position of the (−211) peak of the zirconium oxide layer 234 and a position of the (220) peak of the silicon substrate 210 is 6.47° or more and 6.54° or less. Specifically, the difference Δ2 is a value obtained by subtracting a position of the (−211) peak of the zirconium oxide layer 234 from a position of the (220) peak of the silicon substrate 210.

In the XRD of the diaphragm 230, a full width at half maximum (FWHM) of the (−111) peak of the zirconium oxide layer 234 is 0.320° or more and 0.479° or less.

The position of the (002) peak of the zirconium oxide layer 234, the position of the (−211) peak of the zirconium oxide layer 234, and the full width at half maximum (FWHM) of the (−111) peak of the zirconium oxide layer 234 depend on the size of stress generated in the zirconium oxide layer 234. Meanwhile, the size of stress generated in the zirconium oxide layer 234 depends on heat treatment temperatures after forming the zirconium oxide layer 234.

The zirconium oxide layer 234 has (−111) preferred orientation. Here, the term "(−111) preferred orientation" means a state in which the intensity of the (−111) peak is the largest among all the peaks attributed to the zirconium oxide layer 234 in the X-ray diffraction curve obtained by XRD measurement.

The XRD measurement is performed, for example, for an exposed region 230a of the diaphragm 230 as illustrated in FIG. 2.

1.4. Features

The liquid discharge head 200 has the following features, for example.

In the liquid discharge head 200, the zirconium oxide layer 234 has (−111) preferred orientation; and in the XRD of the diaphragm 230, a difference Δ1 between a position of the (002) peak of the zirconium oxide layer 234 and a position of the (220) peak of the silicon substrate 210 is 13.26° or more and 13.30° or less. As a result, the liquid discharge head 200 suppresses the occurrence of cracking in the diaphragm 230 compared with a case in which the difference Δ1 is smaller than 13.26°, as in the "4. Examples and Comparative Examples" section described hereinafter.

In the liquid discharge head 200, the zirconium oxide layer 234 has (−111) preferred orientation; and in the XRD of the diaphragm 230, a difference Δ2 between a position of the (−211) peak of the zirconium oxide layer 234 and a position of the (220) peak of the silicon substrate 210 is 6.47° or more and 6.54° or less. As a result, the liquid discharge head 200 suppresses the occurrence of cracking in the diaphragm 230 compared with a case in which the difference Δ2 is smaller than 6.47°, as in the "4. Examples and Comparative Examples" section described hereinafter.

In the liquid discharge head 200, the zirconium oxide layer 234 has (−111) preferred orientation; and a full width at half maximum (FWHM) of the (−111) peak of the zirconium oxide layer 234 is 0.320° or more and 0.479° or less. As a result, the liquid discharge head 200 suppresses the occurrence of cracking in the diaphragm 230 compared with a case in which the full width at half maximum (FWHM) is smaller than 0.320°, as in the "4. Examples and Comparative Examples" section described hereinafter.

2. Manufacturing Method for Liquid Discharge Head

Next, a manufacturing method for the liquid discharge head 200 according to the embodiment will be described with reference to the drawings.

As illustrated in FIG. 3, the diaphragm 230 will be formed on the silicon substrate 210. Specifically, the silicon substrate 210 is thermally oxidized to form the silicon oxide layer 232. Subsequently, a zirconium layer is formed on the silicon oxide layer 232. The zirconium layer is formed by sputtering, for example. The zirconium layer is then thermally oxidized to form the zirconium oxide layer 234. The thermal oxidation temperature of the zirconium layer is 850° C. or higher and 950° C. or lower, for example. Subsequently, the zirconium oxide layer 234 is heat-treated at 850° C. or lower. Here, such a heat treatment need not be performed. Through the above steps, the diaphragm 230 can be formed.

Next, the first electrode 10 is formed on the diaphragm 230. The first electrode 10 is formed by sputtering or vacuum vapor deposition, for example. The first electrode 10 is then patterned by photolithography and etching, for example.

Subsequently, the piezoelectric layer 20 is formed on the first electrode 10. The piezoelectric layer 20 is formed, for example, by a chemical solution deposition (CSD), such as a sol-gel process or metal-organic deposition (MOD). Hereinafter, a forming method for the piezoelectric layer 20 will be described.

First, a precursor solution is prepared, for example, by dissolving or dispersing in an organic solvent a metal complex containing lead, a metal complex containing zirconium, and a metal complex containing titanium.

Examples of the metal complex containing lead include lead acetate. Examples of the metal complex containing zirconium include zirconium tetra-n-butoxide, zirconium (IV) acetylacetonate, zirconium monoacetylacetonate, and zirconium bisacetylacetonate. Examples of the metal complex containing titanium include titanium tetraisopropoxide.

Exemplary solvents for the metal complexes include propanol, butanol, pentanol, hexanol, octanol, polyethylene glycol, propylene glycol, octane, decane, cyclohexane, xylene, toluene, tetrahydrofuran, acetic acid, 2-ethylhexanoic acid, 2-n-butoxyethanol, n-octane, and mixed solvents thereof.

Next, the prepared precursor solution is applied to the first electrode 10 by spin coating or the like, thereby forming a precursor layer. The precursor layer is then dried for a certain time by heating at 100° C. or higher and 250° C. or lower, for example. The dried precursor layer is degreased, for example, by further heating at 300° C. or higher and 550° C. or lower and retaining for a certain time. Subsequently, the degreased precursor layer is crystallized by firing at 700° C. or higher and 800° C. or lower, for example.

The above-described series of steps from the application of the precursor solution to the firing of the precursor layer are repeated a plurality of times. Through the above procedure, the piezoelectric layer 20 can be formed. The piezoelectric layer 20 is then patterned by photolithography and etching, for example.

A heating apparatus used for drying and degreasing of the precursor layer is a hot plate, for example. A heating apparatus used for firing of the precursor layer is an infrared lamp annealing (rapid thermal annealing: RTA) apparatus.

Next, the second electrode 30 is formed on the piezoelectric layer 20. The second electrode 30 is formed by sputtering or vacuum vapor deposition, for example. The second electrode 30 is then patterned by photolithography and etching, for example.

Through the above steps, the piezoelectric element 100 can be formed on the diaphragm 230.

Here, the piezoelectric layer 20 may be formed, not by CSD, but by laser ablation, sputtering, pulsed laser deposition (PLD), chemical vapor deposition (CVD), aerosol deposition, or the like.

Next, the silicon substrate 210 is patterned from the side opposite to the side on which the piezoelectric element 100 is provided, thereby forming the pressure chambers 211 and the supply channels 217 in the silicon substrate 210.

Subsequently, the nozzle plate 220 provided with nozzle holes 222 is joined to the silicon substrate 210, for example, by an adhesive not shown. The protective substrate 240 provided with the circuit board 250 and the compliant substrate 260 is then joined to the diaphragm 230 by the adhesive 203.

Through the above steps, the liquid discharge head 200 can be manufactured.

3. Printer

Figure 4:
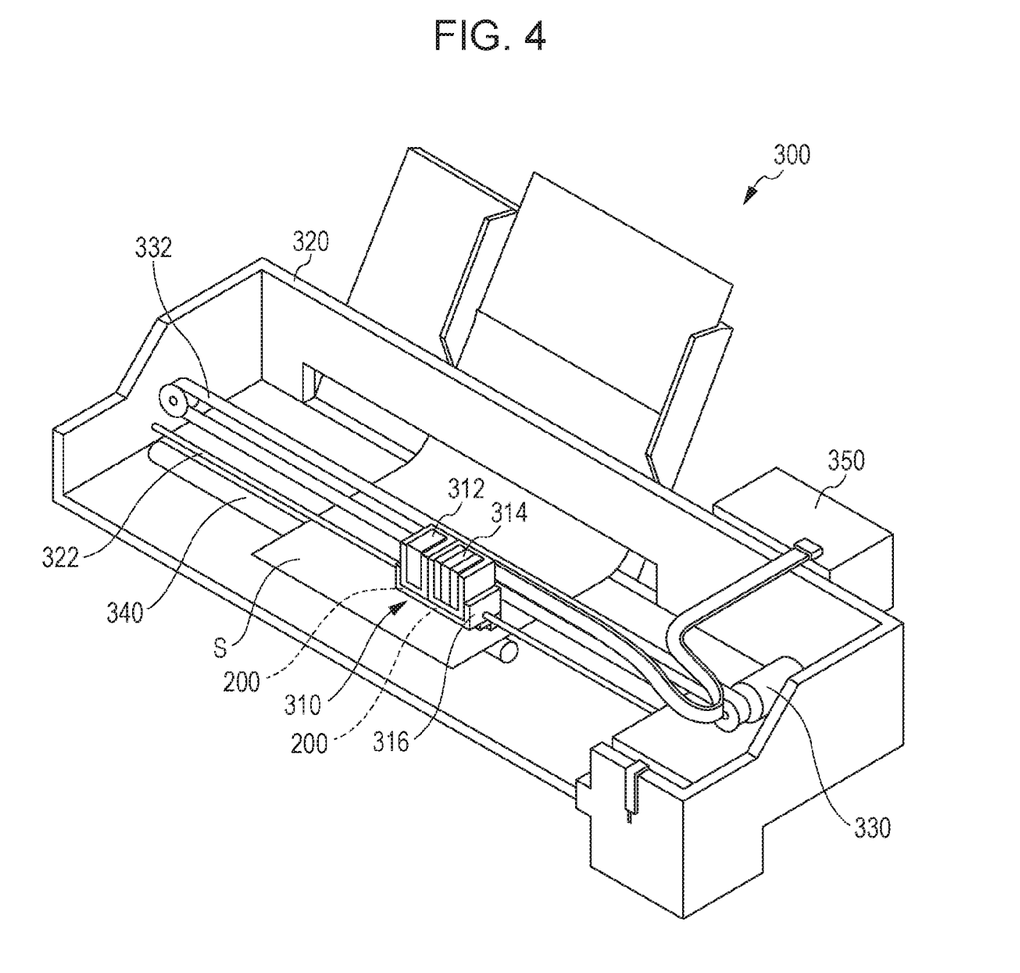
FIG. 4 is a perspective view schematically illustrating a printer according to an embodiment.

Next, a printer according to an embodiment will be described with reference to the drawings. FIG. 4 is a perspective view schematically illustrating a printer 300 according to the embodiment.

The printer 300 is an ink jet-mode printer. The printer 300 includes a head unit 310, as illustrated in FIG. 4. The head unit 310 includes liquid discharge heads 200, for example. The number of the liquid discharge heads 200 is not particularly limited. The head unit 310 is provided with detachable cartridges 312 and 314 that constitute supply means. A carriage 316, on which the head unit 310 is mounted, is provided on a carriage shaft 322, which is fixed to an apparatus body 320, so as to be freely movable in the axial direction and discharges a liquid supplied from the liquid supply means.

A liquid herein may be a material in a state where a substance is in the liquid phase, and a material in the liquid state, such as sol or gel, is also included in the liquid. Moreover, such liquids encompass, for example, not only a liquid as a state of a substance, but also a solvent in which particles of a solid functional material, such as pigment or metal particles, are dissolved, dispersed, or mixed. Representative examples of liquids include ink and liquid crystal emulsifiers. The ink herein encompasses various liquid compositions, such as common aqueous ink and oil-based ink, gel ink, and hot-melt ink.

In the printer 300, the carriage 316, on which the head unit 310 is mounted, is moved along the carriage shaft 322 by transmitting the driving force of a driving motor 330 to the carriage 316 through a plurality of gears not shown and a timing belt 332. Meanwhile, the apparatus body 320 is provided with a transport roller 340 as a transport mechanism for moving a sheet S, which is paper or other recording media, relative to the liquid discharge heads 200. The transport mechanism for transporting the sheet S is not limited to a transport roller and may be a belt, a drum, or the like.

The printer 300 includes a printer controller 350 as a control unit that controls the liquid discharge heads 200 and the transport roller 340. The printer controller 350 is electrically coupled to the circuit boards 250 of the liquid discharge heads 200. The printer controller 350 is equipped with, for example, RAM (random access memory) for temporarily storing various data, ROM (read only memory) for storing control programs and the like, CPU (central processing unit), and a driving signal generator circuit for generating driving signals to be supplied to the liquid discharge heads 200.

4. Examples and Comparative Examples 4.1. Preparation of Samples 4.1.1. Example 1

In Example 1, a silicon substrate was thermally oxidized to form a $SiO_2$ layer on the surface of the silicon substrate. Subsequently, a Zr layer was formed on the $SiO_2$ layer by sputtering at a pressure of 0.02 Pa and a substrate temperature of room temperature. As the first heat treatment, the Zr layer was then thermally oxidized at 900° C. to form a $ZrO_2$ layer. The thickness of the $ZrO_2$ layer was set to 400 nm. Through the above procedure, a diaphragm consisting of the $SiO_2$ layer and the $ZrO_2$ layer was formed.

Next, a titanium layer, a platinum layer, and an iridium layer were formed in this order on the diaphragm by sputtering and patterned into a predetermined shape to form a first electrode.

Subsequently, a piezoelectric layer was formed on the first electrode through the following procedure.

A PZT precursor solution was prepared by weighing, in a container, acetic acid and water, then weighing lead acetate, zirconium tetra-n-butoxide, titanium tetraisopropoxide, and polyethylene glycol, followed by stirring with heating at 90° C.

The PZT precursor solution was applied to the first electrode by spin coating to form a PZT precursor layer. The PZT precursor layer was then heated at 100° C. to 500° C., followed by firing at 700° C. to 750° C. with an RTA apparatus. The series of steps from the application of the PZT precursor solution to the firing were repeated six times to form a PZT layer. The PZT layer was then patterned into a predetermined shape.

Subsequently, an iridium layer was formed on the PZT layer and patterned into a predetermined shape to form a second electrode. Next, a mask layer was formed on the silicon substrate, and pressure chambers were formed by wet etching using an alkaline solution and the mask layer as a mask.

4.1.2. Example 2

Example 2 is the same as Example 1 except for performing heat treatment at 750° C. as the second heat treatment after forming a $ZrO_2$ layer through the first heat treatment.

4.1.3. Example 3

Example 3 is the same as Example 1 except for performing heat treatment at 850° C. as the second heat treatment after forming a $ZrO_2$ layer through the first heat treatment.

4.1.4. Comparative Example 1

Comparative Example 1 is the same as Example 1 except for performing heat treatment at 1,000° C. as the second heat treatment after forming a $ZrO_2$ layer through the first heat treatment.

4.1.5. Comparative Example 2

Comparative Example 2 is the same as Example 1 except for: performing heat treatment at 850° C. as the second heat treatment after forming a $ZrO_2$ layer through the first heat treatment; and forming two $ZrO_2$ layers by further repeating a series of steps of forming a Zr layer, thermally oxidizing the Zr layer through the first heat treatment, and performing the second heat treatment at 850° C. In Comparative Example 2, the thickness of one $ZrO_2$ layer was 400 nm and the thickness of two $ZrO_2$ layers was thus 800 nm.

4.2. Characteristics Evaluation

For the above-described samples, XRD measurement of each diaphragm was performed. For the XRD measurement, "D8 Discover with GADDS" from Bruker Corporation was used. The measurement conditions were tube voltage: 50 kV, tube current: 100 mA, detector distance: 15 cm, collimator diameter: 0.3 mm, and measurement time: 180 sec. The obtained two-dimensional data were converted into an X-ray diffraction curve by the accompanying software at 2θ range: 20° to 50°, χ range: −95° to −85°, step size: 0.02°, and normalized intensity: Bin normalized.

Figure 5:
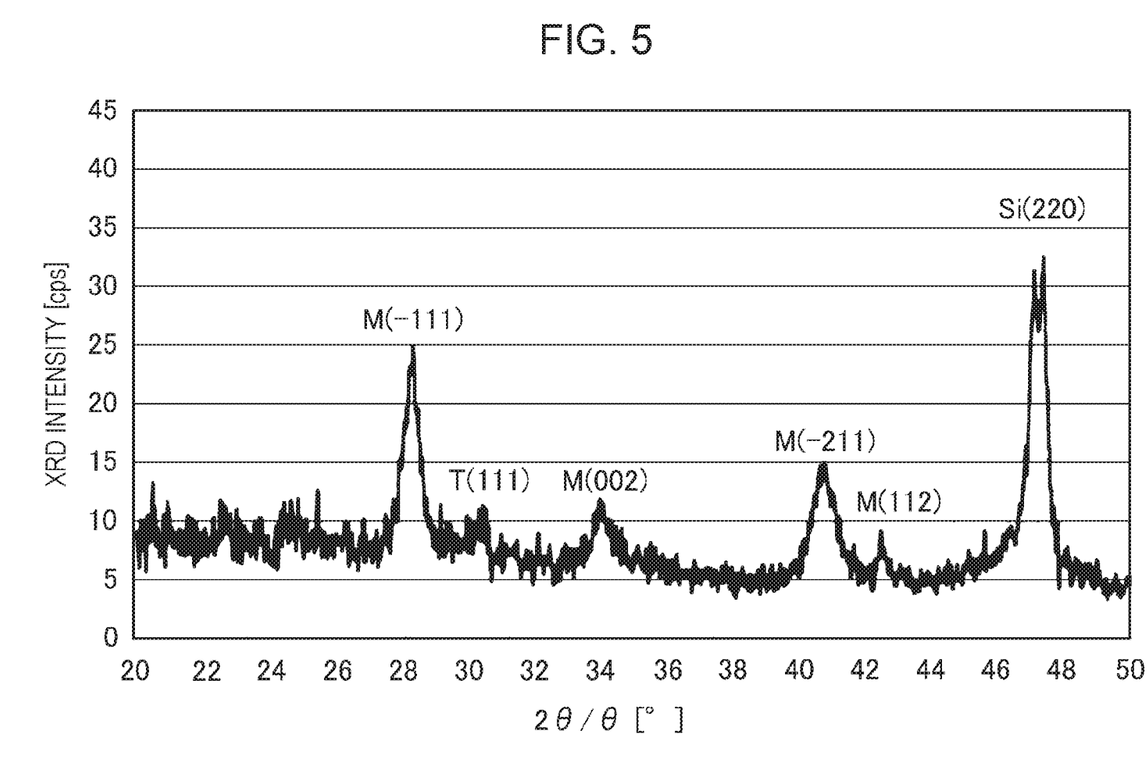
FIG. 5 is a result of XRD measurement for Example 1.
Figure 6:
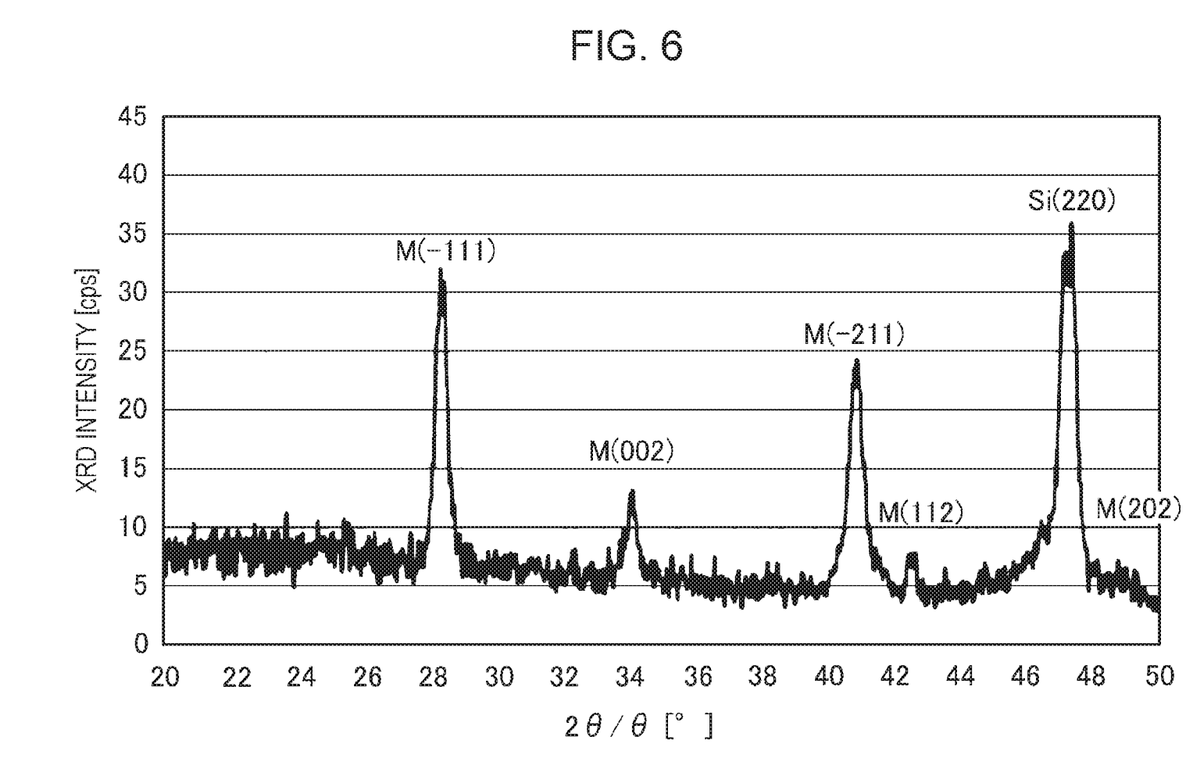
FIG. 6 is a result of XRD measurement for Example 3.

FIG. 5 is a result of XRD measurement for Example 1, and FIG. 6 is a result of XRD measurement for Example 3. In FIGS. 5 and 6, "M" and "T" are peaks attributed to the $ZrO_2$ layer, where "M" is attributed to a monoclinic $ZrO_2$ layer and "T" is attributed to a tetragonal $ZrO_2$ layer. FIGS. 5 and 6 reveal that the $ZrO_2$ layer has (−111) preferred orientation in Examples 1 and 3. Similarly, the $ZrO_2$ layer had (−111) preferred orientation in Example 2.

Figure 7:
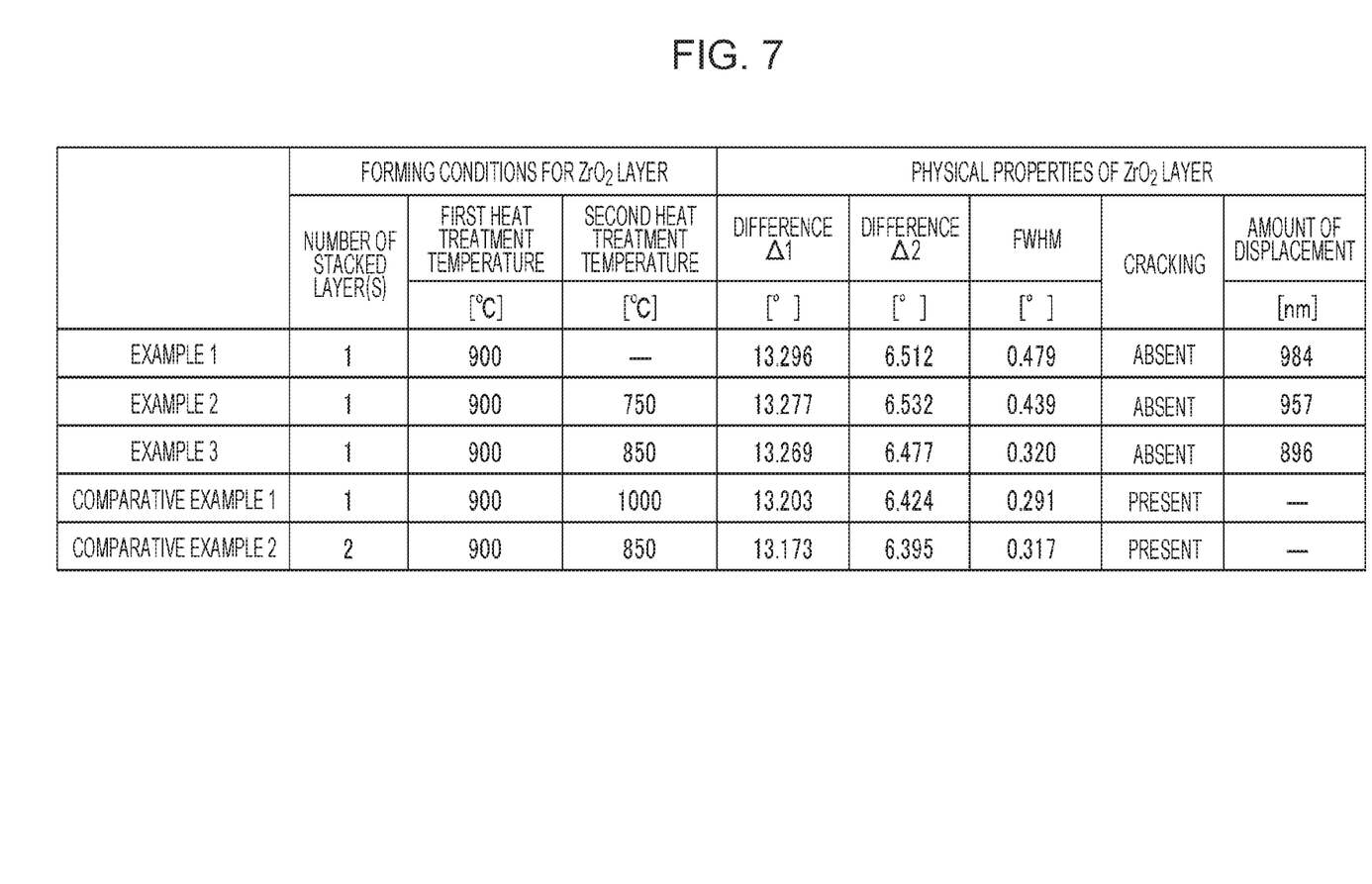
FIG. 7 is a table showing, for Examples 1 to 3 and Comparative Examples 1 and 2, differences between peak positions in the X-ray diffraction curve, a full width at half maximum of the (−111) peak of the $ZrO_2$ layer, presence or absence of cracking in the diaphragm, and the amount of displacement of the diaphragm.

FIG. 7 is a table showing, for Examples 1 to 3 and Comparative Examples 1 and 2, differences Δ1 and Δ2 between peak positions in the X-ray diffraction curve, a full width at half maximum (FWHM) of the (−111) peak of the $ZrO_2$ layer, presence or absence of cracking in the diaphragm, and the amount of displacement of the diaphragm. The difference Δ1 is a value obtained by subtracting a position of the (002) peak of the $ZrO_2$ layer from a position of the (220) peak of the silicon substrate. The difference Δ2 is a value obtained by subtracting a position of the (−211) peak of the $ZrO_2$ layer from the position of a (220) peak of the silicon substrate.

The amount of displacement of the diaphragm was determined by using a 3D white-light interference microscope from Bruker Corporation. The amount of deflection in a state without application of voltage to the piezoelectric element and the amount of deflection in a state under application of direct-current voltage of 50 V to the piezoelectric element were measured at room temperature. A value obtained by subtracting the amount of deflection in the state without application of voltage from the amount of deflection in the state under application of voltage was regarded as the amount of displacement of the diaphragm.

As shown in FIG. 7, when pressure chambers were formed in Comparative Examples 1 and 2, the diaphragm curved toward the pressure chambers, thereby causing cracking in the diaphragm. Meanwhile, cracking did not occur in the diaphragm in Examples 1 to 3. This reveals that the occurrence of cracking in the diaphragm can be suppressed by controlling the difference Δ1 within 13.26° or more and 13.30° or less. Moreover, it was found that the occurrence of cracking in the diaphragm can be suppressed by controlling the difference Δ2 within 6.47° or more and 6.54° or less. Further, it was found that the occurrence of cracking in the diaphragm can be suppressed by controlling the full width at half maximum (FWHM) of the (−111) peak of the $ZrO_2$ layer within 0.320° or more and 0.479° or less. In Comparative Examples 1 and 2, the amount of displacement of the diaphragm could not be measured since cracking occurred in the diaphragm.

The present disclosure is not limited to the above-described embodiments and various modifications are further possible. For example, the present disclosure encompasses the constitution substantially the same as the constitution described as the embodiment. The substantially same constitution is the constitution with the same function, method, and results or the constitution with the same object and effects, for example. In addition, the present disclosure encompasses the constitution that is described as the embodiment but is replaced in the nonessential portion. Moreover, the present disclosure encompasses the constitution that exerts the same advantageous effects as the constitution described as the embodiment or the constitution that can attain the same object as the constitution described as the embodiment. Further, the present disclosure encompasses the constitution in which the constitution described as the embodiment is added with a publicly-known technique.

What is claimed is:

1. A liquid discharge head comprising:
a nozzle plate provided with a nozzle hole that discharges a liquid;
a silicon substrate provided with a pressure chamber that is connected with the nozzle hole;
a diaphragm provided on the silicon substrate; and
a piezoelectric element that is provided on the diaphragm and that changes a volume of the pressure chamber, wherein:
the diaphragm includes a zirconium oxide layer;
the zirconium oxide layer has (−111) preferred orientation;
the zirconium oxide layer does not have (111) preferred orientation; and
in X-ray diffraction of the diaphragm, a difference between a position of (002) peak of the zirconium oxide layer and a position of (220) peak of the silicon substrate is 13.26° or more and 13.30° or less.

2. A liquid discharge head comprising:
a nozzle plate provided with a nozzle hole that discharges a liquid;
a silicon substrate provided with a pressure chamber that is connected with the nozzle hole;
a diaphragm provided on the silicon substrate; and
a piezoelectric element that is provided on the diaphragm and that changes a volume of the pressure chamber, wherein:
the diaphragm includes a zirconium oxide layer;
the zirconium oxide layer has (−111) preferred orientation;
the zirconium oxide layer does not have (111) preferred orientation; and
in X-ray diffraction of the diaphragm, a difference between a position of (−211) peak of the zirconium oxide layer and a position of (220) peak of the silicon substrate is 6.47° or more and 6.54° or less.

3. A liquid discharge head comprising:
a nozzle plate provided with a nozzle hole that discharges a liquid;
a silicon substrate provided with a pressure chamber that is connected with the nozzle hole;
a diaphragm provided on the silicon substrate; and
a piezoelectric element that is provided on the diaphragm and that changes a volume of the pressure chamber, wherein:
the diaphragm includes a zirconium oxide layer;
the zirconium oxide layer has (−111) preferred orientation;
the zirconium oxide layer does not have (111) preferred orientation; and
in X-ray diffraction of the diaphragm, a full width at half maximum of (−111) peak of the zirconium oxide layer is 0.320° or more and 0.479° or less.

4. The liquid discharge head according to claim 1, wherein
the diaphragm includes only one layer as the zirconium oxide layer.

5. The liquid discharge head according to claim 1, wherein the zirconium oxide layer has a thickness of 350 nm or more and 450 nm or less.

6. The liquid discharge head according to claim 1, wherein the piezoelectric element includes a piezoelectric layer that contains a complex oxide having a perovskite structure and including lead, zirconium, and titanium.

7. A printer comprising:
the liquid discharge head according to claim 1;
a transport mechanism that moves a recording medium relative to the liquid discharge head; and
a control unit that controls the liquid discharge head and the transport mechanism.

* * * * *